United States Patent
Ballal et al.

(10) Patent No.: US 9,802,642 B2
(45) Date of Patent: Oct. 31, 2017

(54) PHASE CURRENT MEASUREMENT DIAGNOSTIC

(71) Applicant: STEERING SOLUTIONS IP HOLDING CORPORATION, Saginaw, MI (US)

(72) Inventors: Siddharth Ballal, Saginaw, MI (US); Timothy A. Klinesmith, Mayville, MI (US); Dennis B. Skellenger, Saginaw, MI (US)

(73) Assignee: STEERING SOLUTIONS IP HOLDING CORPORATION, Saginaw, MI (US)

( * ) Notice: Subject to any disclaimer, the term of this patent is extended or adjusted under 35 U.S.C. 154(b) by 263 days.

(21) Appl. No.: 14/657,451

(22) Filed: Mar. 13, 2015

(65) Prior Publication Data

US 2015/0291207 A1 Oct. 15, 2015

Related U.S. Application Data

(60) Provisional application No. 61/978,311, filed on Apr. 11, 2014.

(51) Int. Cl.
*H02P 21/00* (2016.01)
*B62D 5/04* (2006.01)
*G01R 19/00* (2006.01)
*G01R 31/34* (2006.01)
*H02P 21/14* (2016.01)
(Continued)

(52) U.S. Cl.
CPC ......... *B62D 5/0463* (2013.01); *B62D 5/0487* (2013.01); *G01R 19/0092* (2013.01); *G01R 31/343* (2013.01); *H02P 21/14* (2013.01); *H02P 21/18* (2016.02); *H02P 21/20* (2016.02); *H02P 21/22* (2016.02)

(58) Field of Classification Search
CPC .. H02P 6/18; H02P 21/26; H02P 21/06; H02P 25/024; H02P 27/06
See application file for complete search history.

(56) References Cited

U.S. PATENT DOCUMENTS

2007/0085508 A1* 4/2007 Fujitsuna ............... H02P 6/185
318/712
2011/0133678 A1* 6/2011 Tomigashi ............. H02P 21/22
318/400.04

(Continued)

OTHER PUBLICATIONS

EU Search Search Report: EU Application No. 15163018.9-1804/2930843, EU Search Report pursuant to Rule 62 EPC, dated Jan. 21, 2016, pp. 1-23.

(Continued)

*Primary Examiner* — Kawing Chan
*Assistant Examiner* — Zoheb Imtiaz
(74) *Attorney, Agent, or Firm* — Cantor Colburn LLP

(57) ABSTRACT

A method of controlling a motor of a power steering system is provided. The method generates a direct-axis voltage command and a quadrature-axis voltage command based on a current measurement signal received from the motor. The method transforms the direct-axis voltage command and the quadrature-axis voltage command into an alpha voltage command and a beta voltage command. The method determines an offset error in the phase current measurement based on the alpha and beta voltage commands.

18 Claims, 7 Drawing Sheets

(51) Int. Cl.
*H02P 21/22* (2016.01)
*H02P 21/18* (2016.01)
*H02P 21/20* (2016.01)

(56) References Cited

U.S. PATENT DOCUMENTS

| | | |
|---|---|---|
| 2013/0106332 A1 | 5/2013 | Williams et al. |
| 2013/0138300 A1* | 5/2013 | Hayama .............. B62D 6/00 701/43 |
| 2013/0229135 A1 | 9/2013 | Long et al. |

OTHER PUBLICATIONS

Oh et al., "A Novel Predictive Current Control of Induction Motor Using Resonant DC Link Inverter", Dept. of Electrical Engineering, Korea Advanced Institute of Science and Technology, Taejon, Korea, Publication date-May 8, 1996, pp. 1-6.

\* cited by examiner

PHASE CURRENT MEASUREMENT DIAGNOSTIC

CROSS-REFERENCES TO RELATED APPLICATIONS

This patent application claims priority to U.S. Provisional Patent Application Ser. No. 61/978,311, filed Apr. 11, 2014, which is incorporated herein by reference in its entirety.

BACKGROUND OF THE INVENTION

Phase current measurement is part of a measurement scheme in a poly-phase (e.g., three-phase) electric machine control system operating in a torque control mode that utilizes current measurement signals in a current control feedback loop. Conventional control systems for multi-phase electric machines, such as permanent magnet synchronous machines (PMSMs), typically utilize a Park transformation or a similar mathematical transformation to convert the measured phase currents in the alternating current (AC) frame (stator reference frame) to the direct current (DC) frame (rotor reference frame, or direct-quadrature (d-q) reference frame) to simplify the control system.

The closed loop current control system operating in the d-q reference frame adjusts the motor voltage command so that the resulting motor current measurement matches the reference motor current command. However, if the measurement of the motor current is incorrect, e.g., due to a large offset error in the phase current measurement, the actual motor current resulting from the adjusted motor voltage will be incorrect. Consequently, this will result in a large motor position dependent torque ripple at the motor shaft. A large torque ripple may produce a motor torque in a direction opposite to the direction of the motor torque command, and it will be difficult to move the motor from specific motor positions. This opposing torque may result in violation of system goals or fault management requirements.

SUMMARY OF THE INVENTION

In one embodiment of the invention, a method of controlling a motor of a power steering system is provided. The method generates a direct-axis voltage command and a quadrature-axis voltage command based on a current measurement signal received from the motor. The method transforms the direct-axis voltage command and the quadrature-axis voltage command into an alpha voltage command and a beta voltage command. The method determines an offset error in the phase current measurement based on the alpha and beta voltage commands.

In another embodiment of the invention, a motor control system is provided. The motor control system comprises a motor, a motor current sensor for measuring motor current from the motor, and a torque control module. The motor control module is configured to generate a direct-axis voltage command and a quadrature-axis voltage command based on a current measurement signal received from the motor, transform the direct-axis voltage command and the quadrature-axis voltage command into an alpha voltage command and a beta voltage command, and determines an offset error in the phase current measurement based on the alpha and beta voltage commands.

These and other advantages and features will become more apparent from the following description taken in conjunction with the drawings.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

Some systems for detecting an offset error in phase current measurement may employ hardware techniques, such as using redundant current-sense amplifiers. These hardware techniques, however, add cost, complexity, and packaging tradeoffs. For instance, using redundant amplifiers to measure phase current of a motor adds costs.

When there is an offset error in current measurement, a current regulator typically ensures reference and measured currents are equal, but the actual motor current motor current will be incorrect. The effect or result of incorrect phase current measurements may be observable in the direct-quadrature (d-q) axis motor voltage commands from the current control loop, but the resulting voltage commands behave like the voltage commands resulting from many other conditions that are not caused by incorrect current measurements behave. This results in poor diagnostic robustness (i.e., false trips). The conditions in which false trips occur include when the system has overall system stability issues, when hard evasive maneuvers are made, when the vehicle is driven over very rough roads, etc.

Embodiments of the invention provide methods and systems for detecting offset errors in phase current measurements. Specifically, the methods and systems perform a coordinate transform of the motor voltage command into the stator reference frame and use the transformed motor voltage command to detect offset errors in phase current measurements. An offset error in the phase current measurement causes an offset error (i.e., discrepancy or difference) in the motor voltage commands transformed into the stator reference frame while the false trip causing conditions, such as stability issues, hard evasive maneuvers, and driving on rough roads do not cause an offset error in the motor voltage commands. This allows for differentiating a real phase current sensor not functioning from other system behaviors that are not related to sensor functioning.

Figure 1:
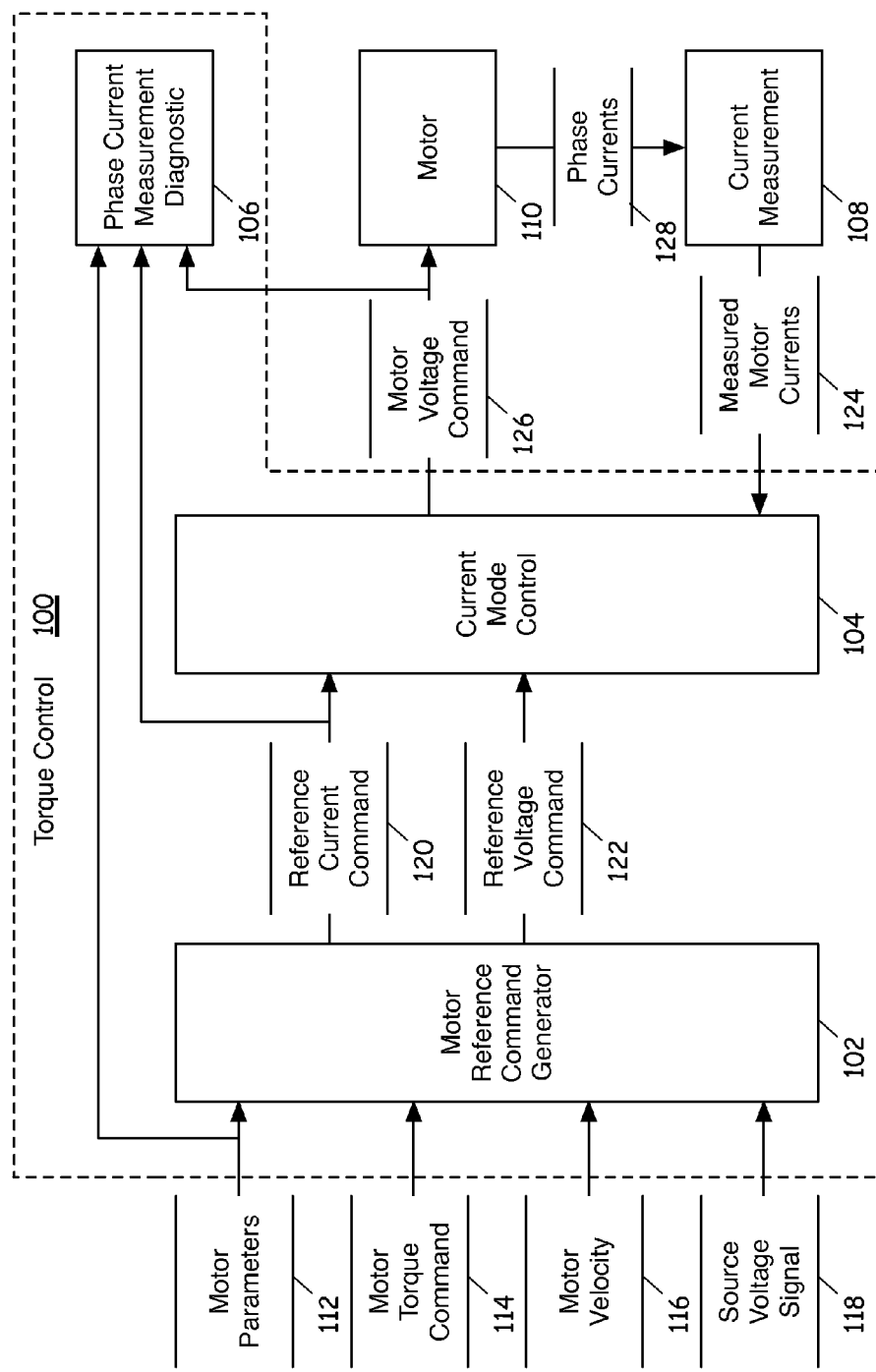
FIG. 1 is an exemplary schematic illustration of a motor control system in accordance with exemplary embodiments.

FIG. 1 depicts a block diagram of a torque control module 100 of a poly-phase permanent magnet synchronous machine (PMSM), utilizing phase current measurements in a current control feedback loop in accordance with some embodiments of the invention. As shown, the torque control module 100 includes a motor reference command generator 102, a current regulator module 104, and a phase current measurement diagnostic module 106. FIG. 1 also depicts a current measurement module 108 and a motor 110. As used herein, the term "module" or "sub-module" refers to an application specific integrated circuit (ASIC), an electronic circuit, a processor (shared, dedicated, or group) and memory that executes one or more software or firmware programs, a combinational logic circuit, and/or other suitable components that provide the described functionality. When implemented in software, a module or a sub-module can be embodied in memory as a non-transitory machine-readable storage medium readable by a processing circuit and storing instructions for execution by the processing circuit for performing a method. Moreover, the modules and sub-modules shown in FIG. 1 may be combined and/or further partitioned.

The motor reference command generator 102 generates a reference current command 120 and a reference voltage command 122 based on input signals, including a motor torque command 114, a motor velocity 116, a source voltage signal 118, and motor parameters 112. The motor torque command 114 represents a commanded torque value, and may be derived from another torque control module (not shown), or may correspond to a torque value generated by an operator. The motor velocity 116 is an angular speed ($\omega$) of the motor 110 measured by a speed sensor (not shown). The speed sensor may include, for example, an encoder and a speed calculation circuit for calculating the angular speed of a rotor of the motor 110 based on a signal received by the encoder. The source voltage signal 118 represents a bridge voltage from a direct current (DC) power source (not shown). The motor parameters 112 are estimated values for the motor 110, including, for example, a motor constant ($K_e$), a motor circuit resistance (R), a direct axis inductance ($L_d$) and a quadrature axis inductance ($L_q$). $K_e$ is the motor voltage constant (Voltage/Radian/second). R is the motor circuit resistance, including the motor stator and controller hardware (Ohms) $L_q$ and $L_d$ are the stator quadrature-axis (q-axis) and direct-axis (d-axis) inductances, respectively (Henries).

In some embodiments, the reference current command 120 generated by the motor reference command generator 102 includes a reference d-axis current command and a reference q-axis current command based on the torque command 114, the source voltage signal 118, and the angular speed. The motor reference command generator 102 also calculates the reference voltage command 122, which may include a reference d-axis voltage command and a reference q-axis voltage command. The reference current command 120 and the reference voltage command 122 satisfy the motor torque command 114.

The current regulator module 104 determines a motor voltage command 126 based on the reference current command 120, the reference voltage command 122, and the measured motor currents 124. The measured motor currents 124 include a measured d-axis current and a measured q-axis current, which are transformed from the current measurement signal in the stator reference frame.

The current regulator module 104 sends the voltage command 126 to the motor 110 to control the motor. Specifically, in some embodiments, a polar conversion controller (not shown) receives as inputs the d-axis voltage command and the q-axis voltage command. Based on the inputs, the polar conversion controller determines a voltage command and a phase advance angle. A PWM inverter controller (not shown) then receives as input signals the voltage command and the phase advance angle from the polar conversion controller. The PWM inverter controller also receives a rotor angle value of the motor 110 measured by a motor position sensor (not shown). In some embodiments, the PWM inverter controller may include an over-modulation space vector PWM unit that generates three respective duty cycle values. The duty cycle values are used to drive gate drive circuits of an inverter (not shown) that energize phases of the motor 110.

For feedback control purposes, the current measurement module 108 generates measured motor currents 124 based on the phase currents 128 from the motor 110. In some embodiments, the current measurement module 108 includes phase current measurement sensors that measure two phase currents (e.g., $\hat{i}_a$ and $\hat{i}_b$ which will be described further below) transmitted to the motor 110. The measured motor currents 124 therefore represent the values of the two phase currents measured by the current measurement module 108. In some embodiments, the current measurement module 108 converts measured values for the AC current (i.e., the values representing the phase current $\hat{i}_a$ and the phase current $\hat{i}_b$ in the stator reference frame) into equivalent measured DC current components, which are a measured d-axis current and a measured q-axis current in the d-q reference frame (rotor reference frame).

The phase current measurement diagnostic module 106 determines whether the measured motor currents 124 generated by the current measurement module 108 represent correct measurements. That is, the phase current measurement diagnostic module 106 determines whether one or more of the phase current measurement sensors of the current measurement module 108 have an offset error. The phase current measurement diagnostic module 106 compares the motor voltage commands with the expected motor voltage commands to determine whether the phase current measurement has an offset error that is large enough to indicate the sensor disablement. In some embodiments, the phase current measurement diagnostic module 106 generates the expected motor voltage commands, which are the voltage commands when there is no offset error in the current measurement, based on the motor parameters 112, the motor velocity 116 and motor current reference commands 120.

In some embodiments, the phase current measurement diagnostic module 106 is an observer that receives inputs and/or outputs of the other sub-modules of the torque control module 100 and does not interfere or affect the performance or functioning of the other sub-modules.

Figure 2:
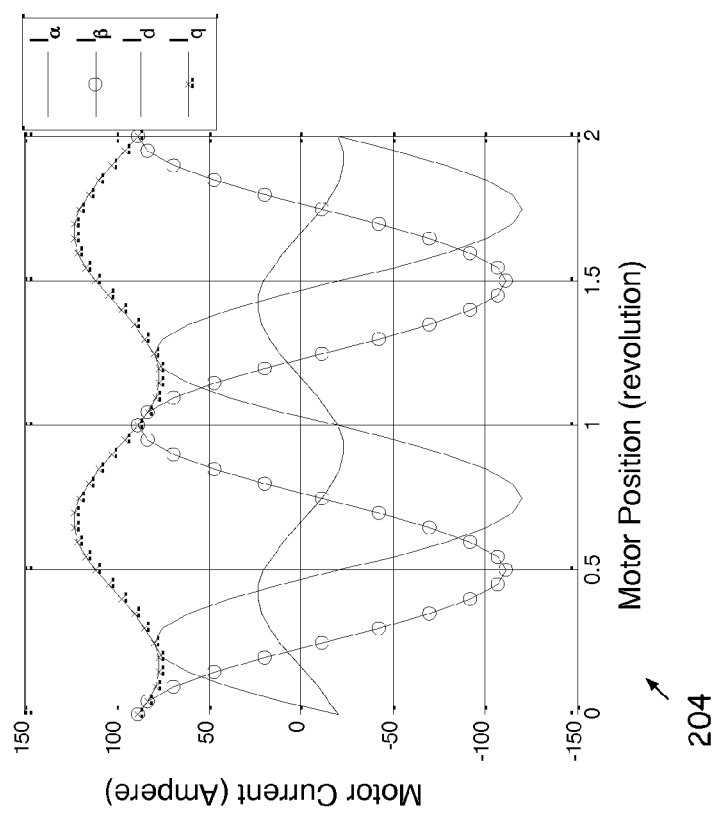
FIG. 2 depicts graphs illustrating measured currents in accordance with exemplary embodiments.
Figure 2:
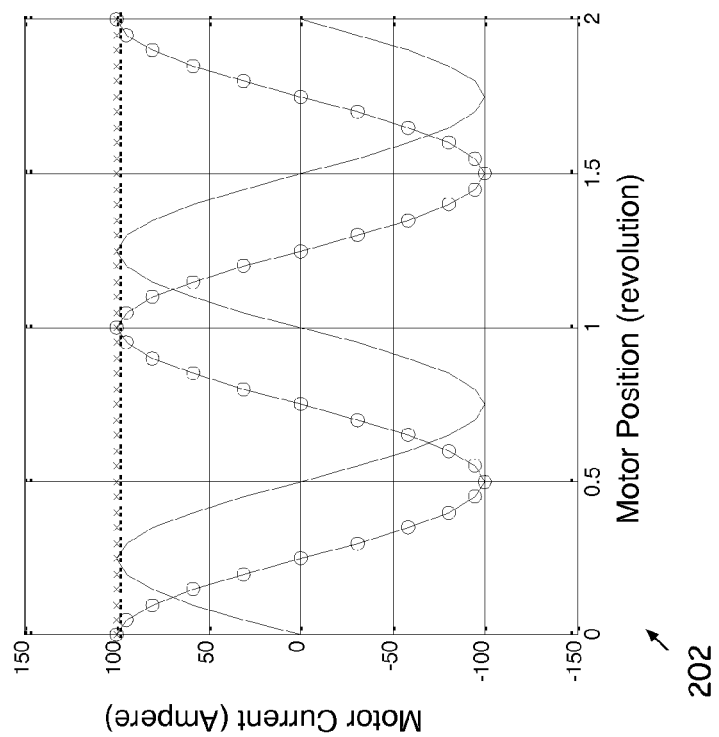

FIG. 2 shows that, when a sinusoidal phase current measurement signal with a discrepancy from the actual or real motor current is mathematically transformed into the synchronously rotating reference frame, the resulting q-axis and d-axis currents contain sinusoidal components corresponding to the discrepancy at the synchronous frequency of the motor in addition to the expected DC components. Specifically, FIG. 2 shows two graphs 202 and 204. Graph 202 shows the measured currents 124 as a function of motor position in the stator and the d-q reference frames when there is no discrepancy between the actual currents and the measured currents 124. As shown by graph 202, the measured currents 124 in the d-q reference frame are constants. Graph 204 shows the measure currents 124 as a function of motor position in the stator and the d-q reference frames when there is a discrepancy between the actual current and the measured motor currents 124. As shown by graph 204, the measured currents 124 in the d-q reference frame have sinusoidal components in addition to the expected DC components.

A discrepancy between the phase current measurement 124 and the actual current can be written as:

$$\hat{i}_b = i_b + \Delta \hat{i}_b$$

$$\hat{i}_c = i_c + \Delta \hat{i}_c$$

where $\hat{i}$ is the measured current 124, i is the actual current and $\Delta i$ is the discrepancy (i.e., offset error) in measurement. In some embodiments, the measured currents $\hat{i}_b$ and $\hat{i}_c$. 124 are transformed into $\hat{i}_\alpha$ and $\hat{i}_\beta$ and then transformed into $\hat{i}_d$ and $\hat{i}_q$ (in the d-q reference frame):

$$\hat{i}_\alpha = -(\hat{i}_b + \hat{i}_c)$$

$$\hat{i}_\beta = \frac{\hat{i}_c - \hat{i}_b}{\sqrt{3}}$$

$$\hat{i}_d = \hat{i}_\alpha \cos\omega t - \hat{i}_\beta \sin\omega t$$

$$\hat{i}_d = i_d = I_0 \cos(\omega t - \phi)$$

$$\hat{i}_q = \hat{i}_\alpha \sin\omega t + \hat{i}_\beta \cos\omega t$$

$$\hat{i}_q = i_q - I_0 \sin(\omega t - \phi)$$

Where $$I_0 = \frac{2}{\sqrt{3}} \sqrt{\Delta i_b^2 + \Delta i_c^2 + \Delta i_b \Delta i_c}$$

$$\phi = \tan^{-1}\left(\frac{\Delta i_c - \Delta i_b}{\sqrt{3}(\Delta i_c + \Delta i_b)}\right)$$

The above equations show that in the rotating reference frame, the measured currents contain a sinusoidal component at the synchronous frequency of the motor velocity 116. This sinusoidal term results in a discrepancy at the input to the current module control module 104. With an assumption that the bandwidth of the feedback current loop is wide enough, the current discrepancy at the input to the current regulator is expected to be zero. This means that the result of the current measurement will follow the reference current command 120 exactly.

Figure 3:
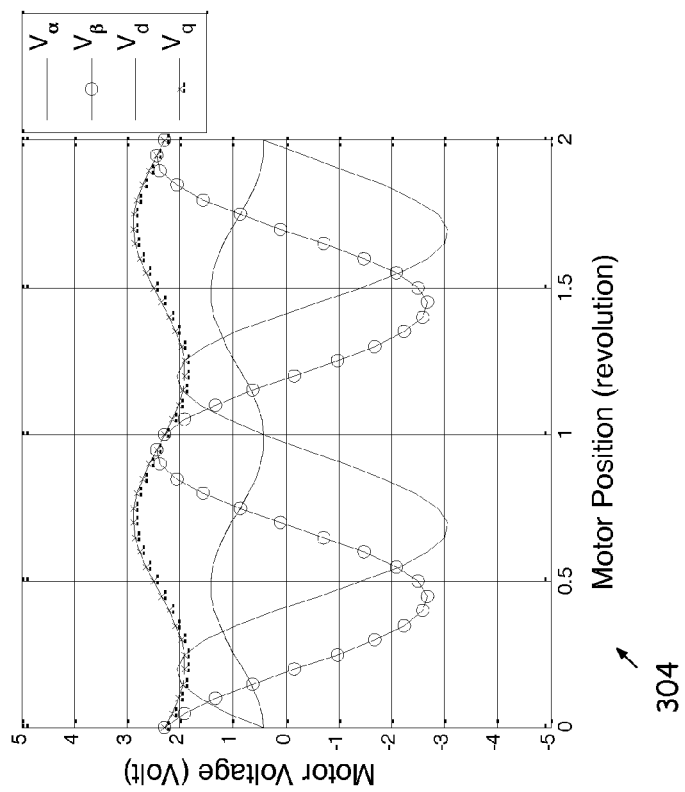
FIG. 3 depicts graphs illustrating voltage commands in accordance with exemplary embodiments.
Figure 3:
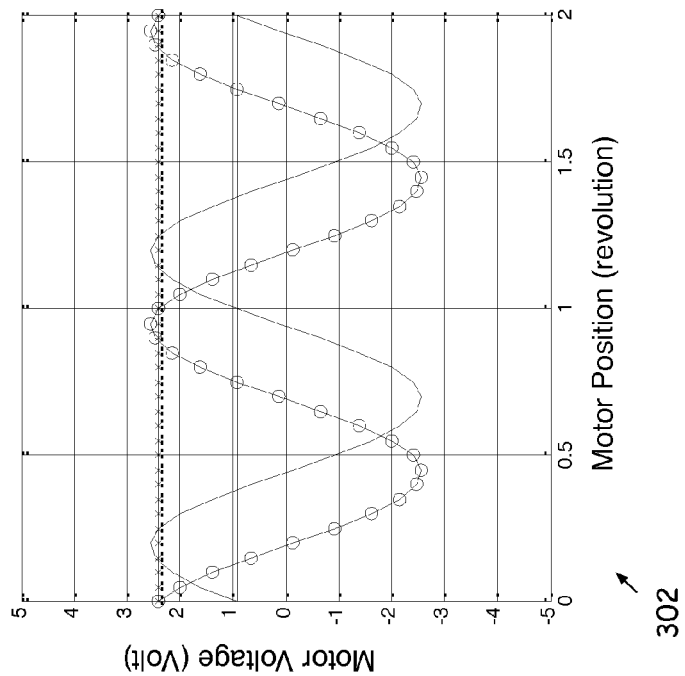

FIG. 3 shows d-axis and q-axis voltage commands (output of the current module control module 104) in the d-q reference frame and the corresponding $\alpha$-axis and $\beta$-axis voltage commands in the stator reference frame. Specifically, FIG. 3 shows two graphs 302 and 304. Graph 302 shows the voltage commands 124 as a function of motor position in the stator and the rotor reference frames when there is no offset between the reference current command 120 (actual motor currents) and the measured currents 124. Graph 304 shows the voltage commands 124 as a function of motor position in the stator and the rotor reference frames when there is a discrepancy between the actual currents and the measured motor currents 124. As shown by graph 304, the voltage commands 124 in the rotor reference frame have information of the discrepancy but it is very difficult to detect the fluctuations in the voltage commands 124 in the rotor reference frame because the voltage commands 124 in the rotor reference frame are small sinusoidal signals sitting on top of the constant DC voltage. In contrast, the voltage commands 124 in the stator reference frame are much easier to analyze because the voltage commands 124 in the stator reference frame have larger fluctuations. It will be appreciated that, the voltage commands in the stator reference frame can be analyzed with the two-phase ($\alpha\beta$) voltage commands disclosed or with three-phase (abc) voltage commands. The embodiments described with ($\alpha\beta$) voltage commands require fewer calculations and therefore, we can be done easier and with less processing time.

Figure 4:
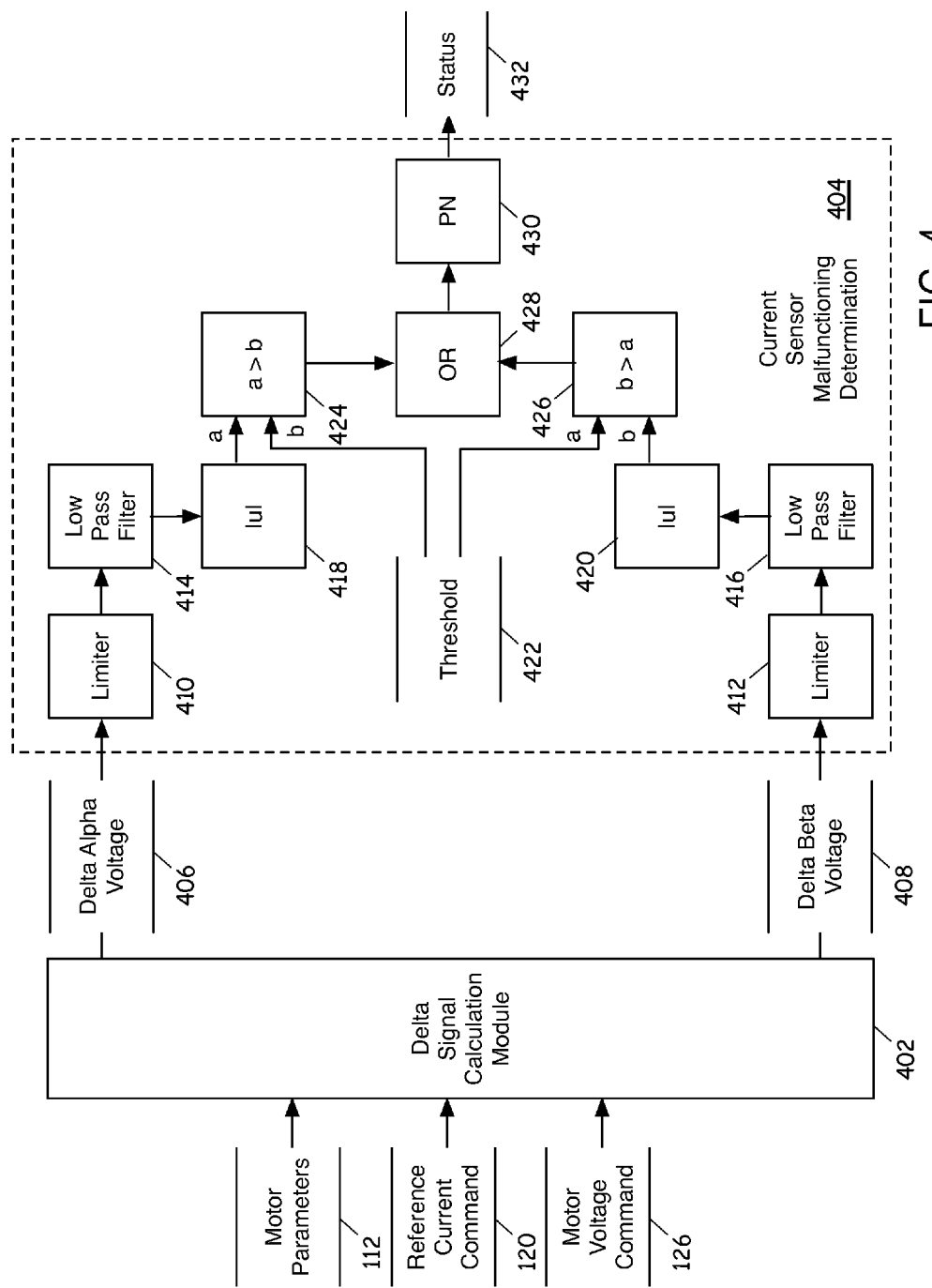
FIG. 4 depicts a schematic diagram of a phase current measurement diagnostic module in accordance with exemplary embodiments.

FIG. 4 depicts the phase current measurement diagnostic module 106 of some embodiments. As shown, the phase current measurement diagnostic module 106 includes a delta signal calculation module 402 and a current sensor malfunctioning determination module 404.

The delta signal calculation module 402 calculates a delta alpha voltage 406 and a delta beta voltage 408 based on inputs, including the motor parameters 112, the reference current commands 120, and the motor voltage command 126. In steady state, the delta voltages in d-q reference frame may be written as:

$$\Delta v_d = (-\Delta i_d) \cdot R + (-\Delta i_q) \cdot \omega_e L_q$$

$$\Delta v_q = -(-\Delta i_d) \cdot \omega_e L_d + (-\Delta i_q) \cdot R$$

$$\Delta v_q = -(-\Delta i_d) \cdot \omega_e L_d + (-\Delta i_q) \cdot R$$

$$\Delta v_q = -I_0 \cos(\omega t - \phi) \cdot \omega_e L_d + I_0 \sin(\omega t - \phi) \cdot R$$

$$= I_0 \cdot Z_d \cdot \left(-\cos(\omega t - \phi) \cdot \frac{\omega_e L_d}{Z_d} + \sin(\omega t - \phi) \cdot \frac{R}{Z_d}\right)$$

$$= I_0 \cdot Z_d \cdot (-\cos(\omega t - \phi) \cdot \sin(\psi_d) + \sin(\omega t - \phi) \cdot \cos(\psi_d))$$

$$= I_0 \cdot Z_d \cdot \sin(\omega t - \phi - \psi_d)$$

$$\Delta v_d = I_0 \cdot Z_q \cdot \cos(\omega t - \phi - \psi_q)$$

where, $$Z_d = \sqrt{R^2 + (\omega_e L_d)^2}$$

$$\psi_d = \tan^{-1}\left(\frac{\omega_e L_d}{R}\right)$$

$$Z_q = \sqrt{R^2 + (\omega_e L_q)^2}$$

$$\psi_q = \tan^{-1}\left(\frac{\omega_e L_q}{R}\right)$$

and $\omega_e$ is electrical speed of the motor.

The delta voltages in d-q reference frame may be summarized as:

$$\Delta v_d = I_0 \cdot Z_q \cdot \cos(\omega t - \phi - \psi_q)$$

$$\Delta v_q = I_0 \cdot Z_d \cdot \sin(\omega t - \phi - \psi_d)$$

The delta signal calculation module 402 then uses a mathematical transformation (e.g., Clarke transformation) to transform the delta voltages in d-q reference frame into the $\alpha\beta$ reference frame (the stator reference frame) and vice versa.

Using the transform, the delta alpha and the delta beta voltages ($\Delta v_\alpha$ and $\Delta V_\beta$) may be written as follows:

$$\Delta v_\alpha = \Delta v_d \cdot \cos(\omega t) + \Delta v_q \cdot \sin(\omega t)$$

$$= I_0 \cdot Z_q \cdot \cos(\omega t - \phi - \psi_q) \cdot \cos(\omega t) + I_0 \cdot Z_d \cdot \sin(\omega t - \phi - \psi_d) \cdot \sin(\omega t)$$

$$= \frac{I_0}{2} \cdot Z_q \cdot (\cos(-\phi - \psi_q) + \cos(2\omega t - \phi - \psi_q)) + \frac{I_o}{2} \cdot Z_d \cdot$$

$$(\cos(-\phi - \psi_d) - \cos(2\omega t - \phi - \psi_d))$$

$$\Delta v_\alpha = \frac{I_0}{2} \cdot (Z_q \cos(-\phi - \psi_q) + Z_d \cos(-\phi - \psi_d)) +$$

$$\frac{I_0}{2} \cdot (Z_q \cos(2\omega t - \phi - \psi_q) - Z_d \cos(2\omega t - \phi - \psi_d))$$

-continued $$\Delta v_\beta = -\Delta v_d \cdot \sin(\omega t) + \Delta v_q \cdot \cos(\omega t)$$
$$= \frac{I_0}{2} \cdot (-Z_q \sin(-\phi - \psi_q) - Z_d \sin(-\phi - \psi_d)) + \frac{I_0}{2} \cdot$$
$$(-Z_q \sin(2\omega t - \phi - \psi_q) + Z_d \sin(2\omega t - \phi - \psi_d))$$

Figure 5:
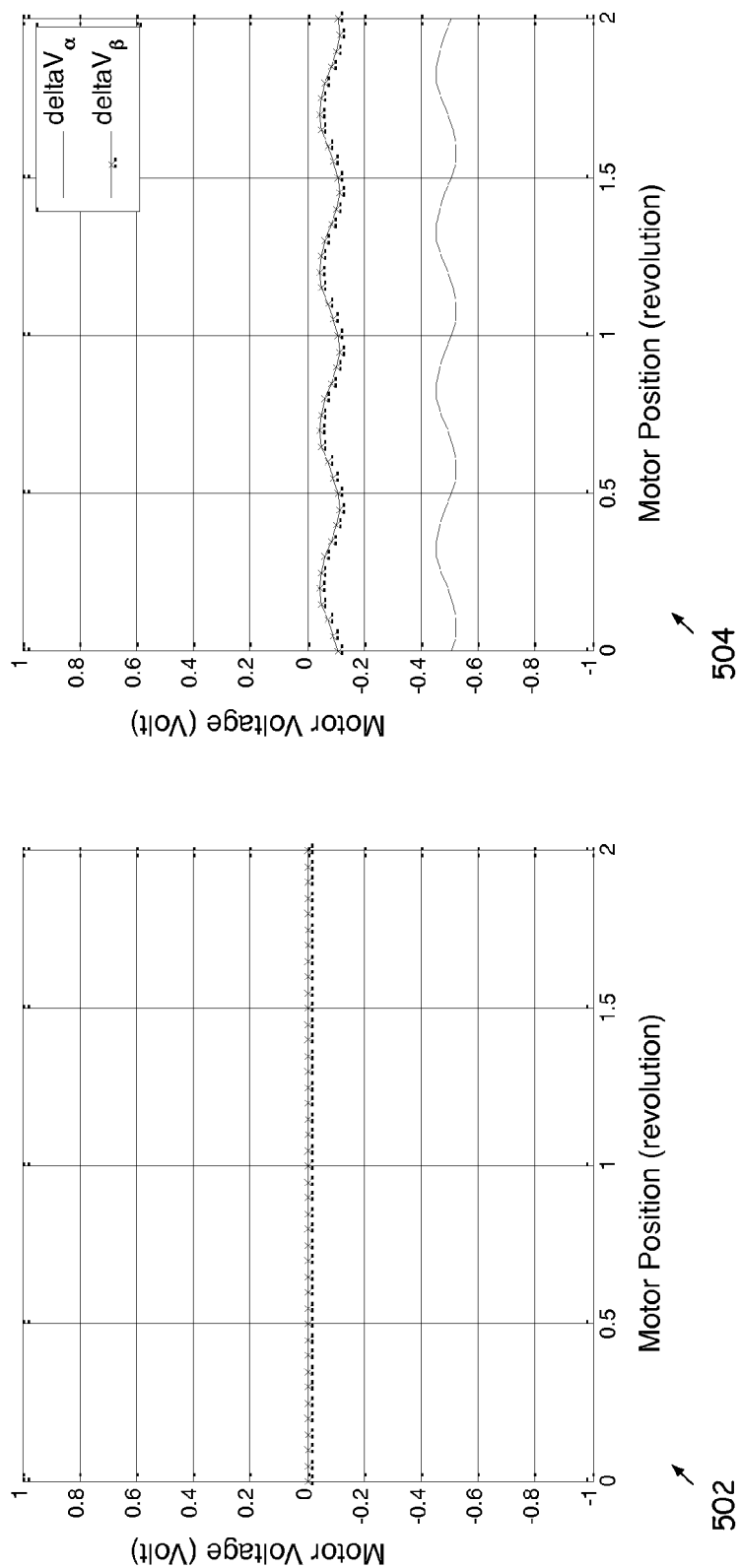
FIG. 5 depicts graphs illustrating delta voltage commands in accordance with exemplary embodiments.

The delta alpha and delta beta voltages contain two terms—a DC component and a sinusoidal component at twice the synchronous frequency of the motor. FIG. 5 illustrates the delta alpha and delta beta voltages 406 and 408 generated by the delta signal calculation module 402 calculates. Specifically, FIG. 5 shows two graphs 502 and 504. Graph 502 shows the delta alpha and delta beta voltages 406 and 408 as a function of motor position when there is no discrepancy between the actual current and the measured currents 124. Graph 504 shows the delta alpha and delta beta voltages 406 and 408 as a function of motor position when there is a discrepancy between the reference current command 120 (actual currents) and the measured motor currents 124.

Referring back to FIG. 4, the current sensor malfunctioning determination module 404 performs a set of operations on the delta alpha voltage 406 and the delta beta voltage 408 to determine whether the phase current sensors of the current measurement module 108 are not functioning properly. In some embodiments, the delta alpha and beta voltages are clamped to minimum and maximum voltage limits by the voltage limiter blocks 410 and 412, respectively. The clamped signals are then filtered by a pair of low pass filters 414 and 416, respectively.

The minimum and maximum voltage limits for the voltage limiter blocks 410 and 412 may be calibrated. The filters 414 and 416 each have a cut-off frequency, which may be calibrated. In some embodiments, the clamp minimum and maximum limits and the cut-off frequencies for the low-pass filters are determined based on design requirements on how quickly a malfunctioning of the current measurement sensors needs to be detected. In some embodiments, the cut-off frequencies of the low pass filters 414 and 416 are chosen to take the DC components of the voltage signals.

In some embodiments, the absolute values of the filtered signals are taken by the blocks 418 and 420, respectively. The absolute value (i.e., the magnitude) of each filtered signal is compared to a threshold voltage level 422 by the comparator blocks 424 and 426, respectively. The threshold voltage level 422 may be calibrated. The OR block 428 determines whether either of the alpha or beta voltage signals exceeds the threshold voltage level 422.

The PN block 428 increments a counter when the OR block 428 determines that either of the alpha or beta voltage signals exceeds the threshold 422. The PN block 428 decrements the counter when the OR block 428 determines that neither of the alpha or beta voltage signals exceeds the threshold 422. When the counter becomes larger than a threshold value, the current sensor malfunctioning determination module 404 outputs a status 432 that indicates that one or more current measurement sensor is not functioning properly. In some embodiments, the status 432 may be used to cause a steering system to perform in a different mode (e.g., a limp-home mode) if the status 432 indicates malfunctioning current measurement sensor. The status 432 may be outputted to an operator or a technician for diagnosing the motor current sensor functioning.

Figure 6:
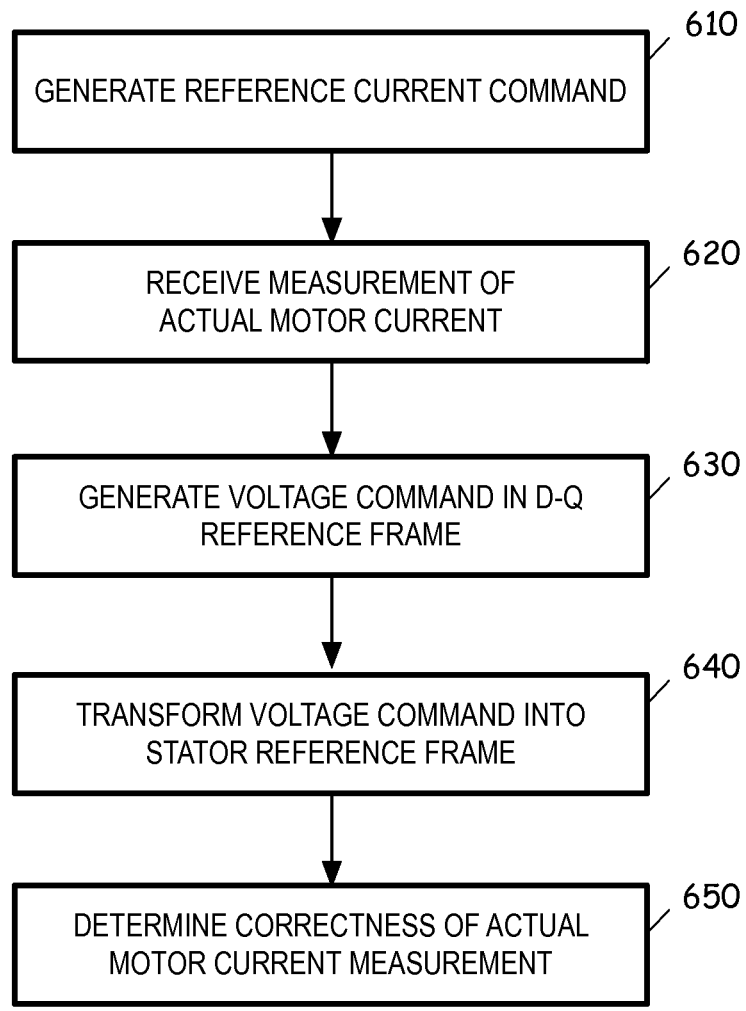
FIG. 6 is flow diagram illustrating a control method for controlling an electric motor in accordance with exemplary embodiments.

FIG. 6 is a flow diagram for a control method that can be performed by the torque control module 100 in accordance with some embodiments of the invention. As can be appreciated in light of the disclosure, the order of operation within the method is not limited to the sequential execution as illustrated in FIG. 6, but may be performed in one or more varying orders as applicable and in accordance with the present disclosure.

At block 610, the torque control module 100 generating a direct-axis voltage command and a quadrature-axis voltage command based on a current measurement signal received from the motor. At block 620, the torque control module 100 transforms the direct-axis voltage command and the quadrature-axis voltage command into an alpha voltage command and a beta voltage command.

At block 630, the torque control module 100 detects an offset error in the phase current measurement based on the alpha and beta voltage commands. Specifically, in some embodiments, the torque control module 100 determines a delta alpha voltage command based on a difference between an expected alpha voltage command and the alpha voltage command. The control module 100 determines a delta beta voltage command based on a difference between an expected beta voltage command and the beta voltage command. The torque control module 100 determines that the phase current measurement has an offset error in response to determining that either a magnitude of the delta alpha voltage command or a magnitude of the delta beta voltage command is greater than a threshold magnitude. The torque control module 100 may also cause a power steering system to perform in a different mode (e.g., limp-home mode) in response to determining that the measurement of the actual current is incorrect. The torque control module 100 may also send the direct-axis voltage signal and the quadrature-axis voltage signal to the motor to control the motor. In some embodiments, the torque control module 100 causes a status indicating the correctness or incorrectness of the current measurement to be displayed. For instance, torque control module 100 outputs the status to an operator or a technician for diagnosing the motor current sensor functioning.

Figure 7:
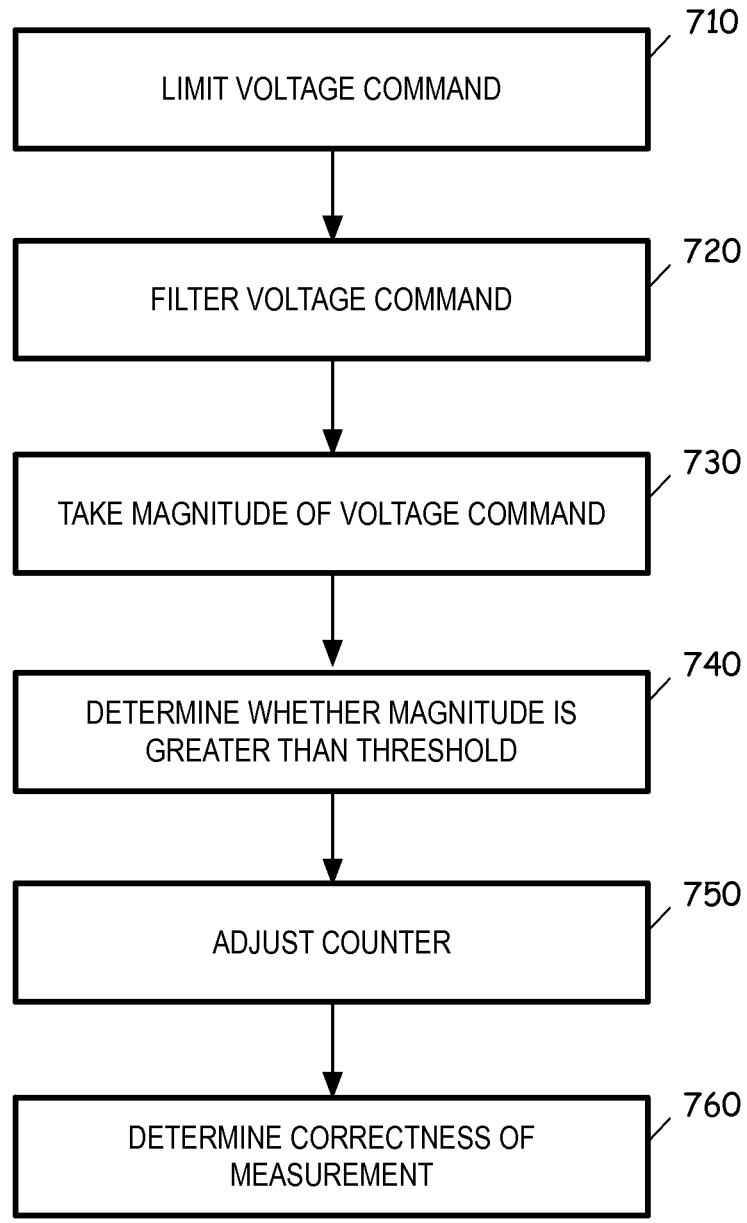
FIG. 7 is flow diagram illustrating a control method for controlling an electric motor in accordance with exemplary embodiments.

FIG. 7 is a flow diagram for a control method that can be performed by the current sensor malfunctioning determination module 404 of the torque control module 100 in accordance with some embodiments of the invention. As can be appreciated in light of the disclosure, the order of operation within the method is not limited to the sequential execution as illustrated in FIG. 7, but may be performed in one or more varying orders as applicable and in accordance with the present disclosure. In some embodiments, the flow diagram illustrated in FIG. 7 provides details to the operations performed at block 630 of FIG. 6.

At block 710, the module 404 limits the transformed voltage command (e.g., transformed at block 640 of FIG. 6 into the stator reference frame) to a range of voltage values. Specifically, the module 404 limits the delta alpha voltage command to a range of voltage values and limits the delta beta voltage command to a range of voltage values. The ranges of voltages values may be calibrated.

At block 720, the module 404 filters the voltage command using one or more low pass filters. The low pass filters each have a cut-off frequency, which are calibratable. At block 730, the module 404 takes magnitude or absolute values of the voltage command filtered at block 720.

At block 740, the module 404 determines whether the magnitude taken at block 730 is greater than a threshold magnitude. At block 750, the module 404 adjusts a counter based on the determination at block 740. Specifically, the module 404 increases the counter in response to determining that either the magnitude of the delta alpha voltage command or a magnitude of the delta beta voltage command is greater than a threshold magnitude. The module 404 decreases the counter in response to determining that neither the magnitude of the delta alpha voltage command nor the magnitude of the delta beta voltage command is greater than the threshold magnitude. The threshold magnitude is calibratable.

At block 760, the module 404 determines correctness of the current measurement (received at block 610 of FIG. 6). Specifically, the module 404 determines that the phase current measurement has an offset error in response to determining that the counter adjusted at block 750 is greater than a threshold value, which may be calibratable. The module 404 determines that the phase current measurement is correct in response to determining that the adjusted counter is not greater than the threshold value.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description.

Having thus described the invention, it is claimed:

1. A method of controlling a motor of a power steering system, the method comprising:
   generating a direct-axis voltage command and a quadrature-axis voltage command in a rotor reference frame based on a phase current measurement signal received from the motor;
   transforming the direct-axis voltage command and the quadrature-axis voltage command into an alpha voltage command and a beta voltage command in a stator reference frame; and
   determining an offset error in phase current measurement based on a voltage command in the stator reference frame, by:
      determining a delta alpha voltage command by computing a difference between an expected alpha voltage command and the alpha voltage command, the expected alpha voltage command being a predetermined alpha voltage command in case of no offset error in the current measurement;
      determining a delta beta voltage command by computing a difference between an expected beta voltage command and the beta voltage command, the expected beta voltage command being a predetermined beta voltage command in case of no offset error in the current measurement; and
      determining that the phase current measurement has the offset error in response to determining that either a magnitude of the delta alpha voltage command or a magnitude of the delta beta voltage command is greater than a threshold magnitude.

2. The method of claim 1, further comprising:
   limiting the delta alpha voltage command to a range of voltage values; and
   limiting the delta beta voltage command to a range of voltage values.

3. The method of claim 2, wherein the ranges are calibratable.

4. The method of claim 1, further comprising:
   filtering the delta alpha voltage command using a first low pass filter; and
   filtering the delta beta voltage command using a second low pass filter.

5. The method of claim 4, wherein a cut-off frequency for the first low pass filter and a cut-off frequency for the second low pass filter are calibratable.

6. The method of claim 1, wherein the determining that the current measurement is incorrect comprises:
   increasing a counter in response to determining that either the magnitude of the delta alpha voltage command or the magnitude of the delta beta voltage command is greater than a threshold magnitude;
   decreasing the counter in response to determining that neither the magnitude of the delta alpha voltage command nor the magnitude of the delta beta voltage command is greater than the threshold magnitude; and
   determining that the measurement of the actual current is incorrect in response to determining that the counter is greater than a threshold value.

7. The method of claim 6, wherein the threshold value is calibratable.

8. The method of claim 1, further comprising:
   causing the power steering system to perform in a different mode in response to determining that the phase current measurement has an offset error.

9. The method of claim 1, further comprising displaying a status indicating a correctness or incorrectness of the phase current measurement.

10. A motor control system, comprising:
    a motor;
    a motor current sensor for measuring motor current from the motor;
    a torque control module configure to:
       generate a direct-axis voltage command and a quadrature-axis voltage command in a rotor reference frame based on a phase current measurement signal received from the motor;
       transform the direct-axis voltage command and the quadrature-axis voltage command into an alpha voltage command and a beta voltage command in a stator reference frame; and
       determine an offset error in the phase current measurement based on the alpha and beta voltage commands, by:
          determining a delta alpha voltage command by computing a difference between an expected alpha voltage command and the alpha voltage command, the expected alpha voltage command being a predetermined alpha voltage command in case of no offset error in the current measurement;
          determining a delta beta voltage command by computing a difference between an expected beta voltage command and the beta voltage command, the expected beta voltage command being a predetermined beta voltage command in case of no offset error in the current measurement; and
          determining that the phase current measurement has the offset error in response to determining that either a magnitude of the delta alpha voltage command or a magnitude of the delta beta voltage command is greater than a threshold magnitude.

11. The system of claim 10, wherein the torque control module is further configured to:
    limit the delta alpha voltage command to a range of voltage values; and limit the delta beta voltage command to a range of voltage values.

12. The system of claim 11, wherein the ranges are calibratable.

13. The system of claim 10, wherein the torque control module is further configured to:
    filter the delta alpha voltage command using a first low pass filter; and
    filter the delta beta voltage command using a second low pass filter.

14. The system of claim 13, wherein a cut-off frequency for the first low pass filter and a cut-off frequency for the second low pass filter are calibratable.

15. The system of claim 10, wherein the torque control module is configured to determine that the current measurement is incorrect by:
    increasing a counter in response to determining that either the magnitude of the delta alpha voltage command or the magnitude of the delta beta voltage command is greater than a threshold magnitude;
    decreasing the counter in response to determining that neither the magnitude of the delta alpha voltage command nor the magnitude of the delta beta voltage command is greater than the threshold magnitude; and
    determining that the measurement of the actual current is incorrect in response to determining that the counter is greater than a threshold value.

16. The system of claim 15, wherein the threshold value is calibratable.

17. The system of claim 10, wherein the torque control module is further configured to:
    cause a power steering system associated with the motor control system to perform in a different mode in response to determining that the current measurement is incorrect.

18. The system of claim 10, wherein the torque control module is further configured to:
    send the direct-axis voltage command and the quadrature-axis voltage command to the motor to control the motor.

* * * * *